United States Patent [19]

Doll et al.

[11] Patent Number: 5,326,424
[45] Date of Patent: Jul. 5, 1994

[54] CUBIC BORON NITRIDE PHOSPHIDE FILMS

[75] Inventors: Gary L. Doll, Southfield, Mich.; Kevin C. Baucom, Alburquerque, N. Mex.

[73] Assignee: General Motors Corporation, Detroit, Mich.

[21] Appl. No.: 909,918

[22] Filed: Jul. 7, 1992

Related U.S. Application Data

[63] Continuation-in-part of Ser. No. 446,758, Dec. 6, 1989, Pat. No. 5,080,153, and a continuation-in-part of Ser. No. 670,854, Mar. 19, 1991, abandoned.

[51] Int. Cl.$^5$ .............................................. C30B 23/06
[52] U.S. Cl. .................................. 117/105; 427/255.1; 427/132; 117/904; 117/952; 117/902; 117/108
[58] Field of Search ................ 156/605, 609, 610, 614, 156/DIG. 68; 427/255.1, 255.2; 437/132; 140/DIG. 113; 204/192.15

[56] References Cited

U.S. PATENT DOCUMENTS

| | | | |
|---|---|---|---|
| 4,683,043 | 7/1987 | Melton et al. | 204/192.12 |
| 4,714,625 | 12/1987 | Chopra et al. | 427/255.3 |
| 4,843,031 | 6/1989 | Bon et al. | 437/129 |
| 4,957,773 | 9/1990 | Spencer et al. | 427/255.2 |
| 4,973,494 | 11/1990 | Yamazaki | 427/255.2 |

OTHER PUBLICATIONS

Motojima et al., "Preparation of Novel B–N–P Ternary Films by Chemical Vapor Deposition", Materials Letters, vol. 8, No. 11,12, Nov. 1989.

Paul, "Laser Assisted Deposition of BN Films on InP for MIS Applications", Electronic Letters, vol. 25, No. 23 (1989) pp. 1602–1603.

Primary Examiner—Robert Kunemund
Attorney, Agent, or Firm—Cary W. Brooks

[57] ABSTRACT

Thin films of single crystal, cubic boron nitride phosphide are provided on, and in crystallographic registry with, an underlying silicon substrate which is oriented along a single crystallographic axis. The cubic boron nitride phosphide films are deposited using laser ablation methods. The boron nitride phosphide film has a crystallographic lattice constant which can be systematically varied depending upon the desired film composition and processing parameters. Preferably, the target, and accordingly the resulting thin film composition, is characterized by a chemical formula of $BN_{(1-x)}P_{(x)}$ where x is about 0.23. This particular composition results in a crystallographic lattice constant essentially equal to the single crystal silicon substrate. The film may also have the formula $BN_{1-x}P_x$ where $x<0\leqq1$. The phosphorus concentration may also be decreased to zero throughout the film so as to provide boron nitride material at the surface, which is characterized by a good crystallographic lattice match with the underlying substrate. The resulting films are particularly suitable for semiconducting applications over a wide range of temperatures.

12 Claims, No Drawings

CUBIC BORON NITRIDE PHOSPHIDE FILMS

This is a continuation-in-part of U.S. Ser. No. 07/446,758, filed Dec. 6, 1989, now U.S. Pat. No. 5,080,153; and a continuation-in-part of U.S. Ser. No. 07/670,854, filed Mar. 18, 1991,now abandoned, the benefit of the filing dates of each being hereby claimed.

This invention generally relates to the formation of thin films of cubic boron nitride phosphide. This invention also relates to a laser ablation method for forming these thin films. These films may be a single crystallographic structure which is in epitaxial registry with an underlying single crystal, silicon substrate.

This invention relates to copending U.S. patent application entitled, "Cubic Boron Nitride Carbide Films", which was filed on the same day as this patent application.

BACKGROUND OF THE INVENTION

Currently within the electronics field, there is a significant demand for an insulating film which can be grown epitaxially and consistently on silicon. Such a film would greatly enhance the capabilities of silicon-based devices for operation at temperatures far exceeding the present limitations.

Boron nitride (BN) is a most interesting III-V compound from both the practical and scientific viewpoints. Boron nitride is characterized by three different crystal structures: hexagonal, wurtzite and cubic zincblende. The boron nitride phase having the cubic zincblende crystal structure is particularly useful since it is characterized by many desirable physical properties including high electrical resistivity and high thermal conductivity. In addition, the cubic zincblende boron nitride is relatively inert chemically. Further, cubic boron nitride films are very hard. Because of these properties, this cubic form of the boron nitride is potentially very useful for electronic devices, particularly for use at high temperatures.

A cubic form of boron nitride has been grown on silicon wafers by means of a laser ablation technique, as disclosed in U.S. patent application Ser. No. 07/446,758 to Gary L. Doll et al, entitled "Laser Deposition of Crystalline Boron Nitride Films", filed on Dec. 6, 1989, and assigned to the same assignee of this patent application. With this laser ablation method, single crystal cubic boron nitride films were epitaxially grown on a silicon substrate oriented along the [100] axis, such that the resulting cubic boron nitride films were in epitaxial registry with the underlying silicon substrate. Two epitaxial registries have been observed for cubic boron nitride on silicon. One epitaxy has the principle axis of a cubic boron nitride with a 0.362 nanometer lattice constant parallel to the crystallographic axes of the silicon, such that three cubic boron nitride lattices oerlay two silicon lattices. The other epitaxy has the [100] direction of a cubic boron nitride with a lattice constant of 0.384 nanometers notched to align with the [110] silicon axis. In this way, two cubic boron nitride lattices overlay one silicon lattice. Since fewer uncompensated silicon bonds exist in the second epitaxy, it is more energetically favorable than the first.

As stated above, the cubic boron nitride has many characteristics useful for high temperature electronic applications. However, in order to successfully grow the cubic boron nitride on the silicon substrates with the more energetically favorable epitaxy, the crystallographic lattice for the cubic boron nitride must expand to match the lattice constant of the underlying silicon. In particular, the cubic boron nitride films formed on the silicon substrate by the laser ablation method described above, are characterized by a crystallographic lattice constant of approximately 0.384 nanometers as compared to the lattice constant of approximately 0.362 nanometers for bulk cubic boron nitride powder. The lattice constant for the cubic boron nitride films formed by the laser ablation method is approximately 5 percent larger than the bulk material. Because of this lattice expansion, two cubic boron nitride unit cells can fit along the [110] silicon direction, so as to result in epitaxial registry between the silicon and cubic boron nitride.

Although this lattice expansion brings the cubic boron nitride into crystallographic registry with the underlying single crystal silicon lattice, a large dislocation energy is always associated with a lattice expansion of this magnitude. It is believed that this large dislocation energy may be accommodated by the presence of pinholes and internal stresses within the film. Without these mechanisms, or some other vehicle for accommodating this large dislocation energy, the cubic phase for boron nitride is energetically unfavorable.

However, these mechanisms present serious engineering problems within the electronic devices formed form these films. One problem is that there is a substantial electrical current leakage through the pinholes. This effect, as well as other less serious problems, if uncorrected makes the cubic boron nitride a less desirable insulator as compared to other materials, such as amorphous silicon dioxide for example.

Therefore, it would be desirable to alleviate these problems and provide an epitaxial insulator for silicon which has a lattice constant similar to the lattice constant of the underlying silicon, and which thereby avoids the shortcomings of the art. In particular, it would be desirable to provide an epitaxial insulator which is characterized by a lattice constant which is substantially equal to $\sqrt{2}/2$ times the lattice constant of the underlying single crystal silicon substrate, so as to minimize or avoid the lattice mismatch and expansion of the epitaxially grown insulating film. An epitaxial film having the thermal and physical characteristics of cubic boron nitride, but with a matched lattice in epitaxial registry with the underlying silicon, would be an excellent candidate for high temperature electronic devices.

SUMMARY OF THE INVENTION

It is an object of this invention to provide an epitaxial insulating layer which is in crystallographic registry with an underlying single crystal silicon substrate.

It is a further object of this invention that such an epitaxial insulating layer have a crystallographic lattice constant essentially similar to the crystallographic lattice constant of an underlying substrate which may be silicon, GaAs, sapphire, metal or any other suitable material.

It is a further object of this invention that such an electrically neutral layer be provided by a cubic boron nitride phosphide.

It is a further object of this invention to provide an interface material for connecting layers of different materials and lattice constants wherein the interface material has a varying amount of phosphorous through its thickness or a gradient concentration, and the interface material comprises $BN_{1-x}P_x$ where $0 < x \leq 1$. The amount of phosphorous in the cubic boron nitride film is much greater than the amount of phosphorous which would be used as an impurity to make a cubic boron nitride film a semiconductor.

In accordance with a preferred embodiment of this invention, these and other objects and advantages are accomplished as follows.

Thin films of cubic boron nitride phosphide are provided on substrates. Such thin films of cubic boron nitride phosphide may be in crystallographic registry with an underlying single crystal silicon substrate.

The thin films of phosphorus doped boron nitride are formed in the following manner. First a substrate, preferably a single crystal silicon substrate oriented along the [100] crystallographic axis, is provided. The substrate is disposed in proximity to an appropriate target. The target includes boron nitride and boron phosphide. An appropriate laser is used to induce vaporization of selective portions of the target containing boron nitride or boron phosphide. The vaporized material deposits onto a surface of the silicon substrate to form a thin film layer of cubic boron nitride phosphide, which may be in epitaxial registry with the underlying substrate. The interface between the cubic boron nitride phosphide film and a silicon substrate is characterized by matched crystallographic lattice constants.

It is believed if a laser is used so that the energy density of the laser is equal to or greater than the band-gap of the boron nitride, cubic boron nitride films will grow on any substrate without regard to the material in the substrate or its crystallographic orientation. Suitable lasers for this purpose include KrF excimer lasers and ArF lasers. Preferably, the ions are emitted from the target so that the ions can reassociate on the substrate so as to for cubic boron nitride or cubic boron nitride phosphide. The process may be enhanced by using ion-assisted pulsed laser deposition to produce cubic boron nitride films. For example, a Kaufman-type ion source may be used to deliver nitrogen ions to a substrate during laser deposition. With an ion-assisted process, broad-beam ion sources may improve adhesion of the films to a substrate, increase the density of nucleation sites, reduce the tensile stress of the films, assist in a preferential crystal orientation, result in the selection of stronger bonds, and provide stoichiometric nitride films.

One embodiment of this invention is a thin film layer of cubic boron nitride phosphide characterized by essentially a single crystal cubic structure which is crystallographically aligned with an underlying silicon substrate and which has a matched crystallographic lattice with the underlying substrate. The cubic boron nitride film has a crystallographic lattice constant which can be varied depending upon the desired film composition and processing parameters. Preferably, the resulting thin film composition has a chemical composition of $BN_{(1-x)}P_{(x)}$ where x is about 0.23. This particular composition results in a crystallographic lattice constant of approximately 0.383 nanometers which essentially aligns with the underlying lattice constant of the single crystal silicon substrate. The resulting films are particularly suitable for semiconducting applications over a wide range of temperatures.

In addition, it is foreseeable that the cubic boron nitride phosphide films could be deposited in such a manner so as to form a gradient throughout the film. The chemical composition would be approximately $BN_{0.77}P_{0.23}$ at the silicon-boron nitride interface for a matched crystallographic lattice structure between the two materials and would gradually decrease to a phosphorus concentration of zero, so as to provide a pure boron nitride surface for any particular applications where a surface of pure boron nitride is desired. The concentration of phosphorous may be varied so that two layers of different materials, or different lattice constances, may be adhered to the interface layer for improved crystallographic, structural, thermal and electrical properties of the multilayer structure. The thin film according to the present invention may have the formula ranging from $BN_{0.9}P_{0.1}$ to $BN_{0.1}P_{0.9}$ and any range of formulas therebetween. This gradient would be achieved by selectively directing the laser on the boron nitride or boron phosphide portions of the target during the laser ablation process.

Other objects and advantages of this invention will be better appreciated from the detailed description thereof, which follows.

DETAILED DESCRIPTION OF THE INVENTION

Thin films of cubic boron nitride phosphide are provided on substrates. The thin films of phosphorus doped boron nitride are lattice matched and in crystallographic registry with the underlying single crystal silicon substrate.

By doping cubic boron nitride with an appropriate amount of phosphorus, a cubic ternary compound having the elemental chemical formula, $BN_{(1-x)}P_{(x)}$ where x represents the phosphorus concentration, is achieved. The ternary crystallographic lattice constant can be systematically varied from that of pure cubic boron nitride to that of pure cubic boron phosphide, if desired. Since cubic boron nitride and cubic boron phosphide are both III-V compounds characterized by the cubic zincblende crystal structure, the relationship between the ternary lattice constant (a) and the phosphorus concentration (x) is expressed by the following equation:

$$a = 0.362 (1-x) + 0.454 (x)$$

where 0.362 and 0.454 are the crystallographic lattice constants in nanometers for bulk cubic boron nitride (BN) and bulk cubic boron phosphide (BP), respectively. For x equal to 0.23, or $BN_{0.77}P_{0.23}$, a ternary lattice constant of a equal to 0.383 nanometers is obtained.

The ternary compound, $BN_{0.77}P_{0.23}$, will grow along a preferred orientation on the underlying single crystal silicon substrate. It is preferred that the underlying single crystal silicon substrate be oriented along the [100] axis, so as to expose the preferential orientation for epitaxial growth. The [100] axis of the phosphorus doped cubic boron nitride compound, $BN_{0.77}P_{0.23}$, will preferentially grow in a direction parallel to the [110] silicon axis, and the [001] axis of the phosphorus doped cubic boron nitride compound is parallel with the [001] silicon axis.

The resulting film of the preferred cubic boron nitride-phosphide compound is characterized by a matched interface between the film and underlying silicon substrate, thereby minimizing any stresses due to a mismatched lattice. This accordingly results in a higher quality interface between the materials and better electrical properties. Correspondingly, any device formed from this material would be of a higher quality than one formed from materials having mismatched lattice constants.

In particular, the 0.383 nanometer lattice constant of the preferred cubic boron nitride-phosphide compound, $BN_{0.77}P_{0.23}$, is particularly well suited to the silicon substrate. Since silicon has a diamond-like crystallographic structure with a lattice constant of approximately 0.542 nanometers, two of the cubic boron nitride-phosphide compounds will fit across the [110] diagonal of the silicon lattice, i.e., the lattice constant for the preferred cubic boron nitride compound of 0.383 nanometers equals 0.542 nanometers divided by $2^{\frac{1}{2}}$. In this preferred orientation for growth, any of the elements, boron, nitrogen or phosphorus, will reside over the silicon atoms. Therefore, the preferred phosphorus doped cubic boron nitride films, having the chemical composition of $BN_{0.77}P_{0.23}$ may be grown heteroepitaxially on the [100] silicon.

The preferred method for forming the preferred phosphorus doped cubic boron nitride films utilizes laser ablation techniques, such as described in the copending U.S. patent application Ser. No. 07/446,758, which is incorporated herein by reference. Generally, a boron nitride target containing polycrystalline, hexagonal pyrolitic boron nitride which has been doped and sintered with the preferred amount of phosphorus ($BN_{0.77}P_{0.23}$) is provided on a rotating turntable and appropriately located in spaced relationship to the single-crystal silicon substrate within a stainless steel 6-way cross chamber which is evacuated to an appropriately low pressure. The single crystal substrate is heated to approximately 400° C. to ensure good adhesion and crystal growth, and the temperature is maintained during the ablation and deposition process. Higher temperatures have been utilized, however the resulting films do not exhibit uniform crystallinity throughout. It has been determined that a temperature of up to about 400° C. provides the optimum crystallographic results within the film.

Preferably, a KrF excimer laser source operating at an appropriate wavelength and frequency is used as the ablating beam. The laser operates and the ablation occurs in a chamber filled with ultra-high purity nitrogen gas and laser fluences ranging from about 1.5 to about 5.2 J/cm$^2$. The energy emitted from the laser operating at these parameters would be approximately 5 electron volts, which is nearly coincident with the electronic bond gap of the target of boron nitride and boron phosphorous.

The thickness of the cubic boron nitride thin films was determined to vary linearly with laser fluence and the number of laser pulses. At a laser fluence of approximately 3.9 J/cm$^2$, an average deposition rate of approximately 0.182 Angstroms per pulse can be expected. For a 12,000 pulse run and a laser fluence of approximately 1.5 J/cm$^2$, a cubic boron nitride phosphide film having a thickness of approximately 175 nanometers would be produced. Any thickness within practical considerations could be formed with this method.

The band gap for cubic boron nitride is approximately 6 electron Volts, while that of cubic boron phosphide is approximately 2 electron Volts. We believe that the band gap energy for the ternary $BN_{(1-x)}P_{(x)}$ compound will be large and at least comparable to that of cubic boron nitride for small values of x, including when x is 0.23 the preferred value for epitaxial growth and matched crystallographic lattice constants. The combination of this large band gap energy, and the small lattice mismatch with the underlying silicon substrate should make this preferred ternary compound a superior insulator for high-temperature, silicon-based semiconducting devices. Examples would be heterostructures for light emitting diodes or semiconducting lasers, as well as other devices.

In addition, with this method the phosphorus concentration can be systematically varied within the ternary $BN_{(1-x)}P_{(x)}$ compound from x=0.23 to x=0. With this gradual transition, the cubic boron nitride phosphide film would act as a buffer layer between the underlying silicon substrate and a cubic boron nitride film, with minimal stress resulting due to the gradual change in lattice constants throughout the film. This would allow a device to take advantage of the excellent physical properties of cubic boron nitride for electronic, acoustic and tribological applications. FIG. 1, illustrates one embodiment of a gradient according to the present invention. FIG. 1 shows a silicon substrate, an interface layer and a cubic boron nitride layer. The interface layer is a material having the formula $BN_{1-x}P_x$ where x=0.23 at the interface with the silicon substrate and x=0 at the interface with the cubic boron nitride layer. The concentration of phosphorous gradually decreases throughout the interface layer from the silicon substrate to the cubic boron nitride. The interface layer may have the formula $BN_{1-x}P_x$ where $0 \leq x \leq 1$. The phosphorus composition could be varied by providing a target which is composed of discrete regions, such as like a pie shape, wherein each region has a different predetermined concentration of phosphorus. The laser would then be focused on each region as necessary to deposit upon the substrate, the cubic boron nitride phosphide composition having the appropriate phosphorus concentration.

In addition, it is foreseeable that this laser ablation method would be used to form the preferred epitaxial cubic boron nitride phosphide film upon the silicon substrate, and then an alternative deposition method could be used to supplement the growth procedure. An illustrative example of such an alternative method would be metallo-organic chemical vapor deposition (MOCVD) techniques. The MOCVD method could be advantageous in that it is easy to accurately adjust and vary the chemical composition of elements, within the MOCVD chamber, thereby permitting facile changes in composition. Further, the deposition rates are higher with the MOCVD technique than with this laser ablation method, particularly for boron nitride which has a low optical absorption and accordingly a low ablation rate. The material deposited by the MOCVD method would retain the cubic crystallographic registry of the cubic boron nitride phosphide film deposited by the laser ablation method. The cubic boron nitride phosphide film may be electrically neutral, i.e., the phosphorous in the film does not act to provide electrons or holes in the film to make it semiconductive. That is, the phosphorous in the film is not present as a dopant.

It is also foreseeable that other elements may be substituted for the nitrogen and phosphorus, such as other column V elements for nitrogen or phosphorus, and other column III elements or tetravalent rare earth elements for boron, and deposited with this method with satisfactory results obtained.

The present invention may include other applications where a cubic boron nitride layer is indirectly adhered to a substrate such as a metal. An example is a cubic boron nitride surgical blade. In such a case, a metal substrate is provided on which an intermediate layer is deposited according to the present invention and having at the substrate interface a composition of the formula $BN_{1-x}P_x$ where $0 < x \leq 1$ and x is selectively to provide good adhesion to the substrate. The concentration of the phosphorous is gradually decreased to zero at the other face of the intermediate layer. The cubic boron nitride layer is deposited on the intermediate layer as described above to provide a cBN cutting surface.

The cubic boron nitride phosphide films of the present invention may be doped with a material other than a III or IV element of the periodic table to give the film semiconductive properties.

In another embodiment of this invention, we have successfully grown oriented, adherent, cubic boron nitride films. The films were grown on (001) faces of silicon using the method of ion-assisted pulse-excimer-laser deposition. We employed a Kaufman-type ion source to deliver nitrogen ions to the substrate during the laser deposition. Although the use of ion-assisted techniques to grown cubic boron films have been described by others such as Arya and Amico, Thin Films 157, 267 (1988) generally, such boron nitride films grown by ion-assisted deposition are not structurally homogeneous and are not very adherent to the substrate. To our knowledge, we have for the first time grown cubic boron nitride films by an ion-assisted pulse-laser deposition technique. The following is a description of an example illustrating the present invention.

The excimer laser beam is focused and tastered across the rotating hexagonal BN target to prevent cratering and excessive beam-induced damage[7]. The energy density of the laser at the target was measured to be $\sim 2.7$ J cm$^{-2}$, which under our present growth conditions results in a deposition rate of $\sim 0.1$ Å/pulse. One inch diameter Si n-type (001) wafers were etched in a buffered HF solution and placed $\sim 5$ cm above the target through a load-lock mechanism in an ultra-high vacuum deposition chamber. The substrates were heated to $\sim 400°$ C. in vacuum. Nitrogen ions from the ion source were directed approximately 2 cm below the Si surface with a beam voltage of 1000 V. During the deposition, the substrate was biased with a $-1500$ V direct current potential to attract the ions through a coulombic interaction. Due to the geometry of the deposition chamber, we are unable to accurately determine the kinetic energies of the $N^+_2/N^+$ species. From the measured ion-induced decrease in the bias of the substrate holder, we estimate the energies of the ions to be approximately 250 eV. During the deposition, the chamber pressure is stable at $1.2 \times 10^{-4}$ torr.

The deposited films have a bluish color, indicative of an optically transparent, antireflective coating approximately 1000 Å thick on the silicon substrate. High-resolution scanning electron microscopy reveals a flat and featureless surface with the exception of scattered fragments of the hexagonal BN target. Contrary to results previously reported for ion-assisted physical vapor deposited BN films [6], our films are extremely adherent to the substrate and exhibit no evidence of peeling. The films are also resistant to chemical attack by acids that dissolve the silicon substrate.

We have grown for the first time preferentially oriented, and extremely adherent cubic BN films on (001) silicon wafers using the method of ion-assisted laser deposition. The films are almost entirely cubic BN with a small fraction of sp$^2$-bonded material present as either hexagonal BN fragments from the target or as an amorphous BN phase not fond with the electron microscope. Since the substrate apparently plays no significant role in the growth of the cubic BN films in this technique, it should be possible to grow ultra-hard, adherent, wear-resistant cubic BN coatings on technologically important materials such as tool steel and aluminum. Additionally, the ability to grow highly thermally conductive cubic BN on materials other than silicon should enhance it's potential as a universally applicable heat sink material.

With this method, cubic boron nitride phosphide films which are in crystallographic registry with an underlying silicon substrate are formed. It is foreseeable that the films would be suitable for use in high temperature electronic applications, as well as other applications. While our invention has been described in terms of preferred embodiments, it is apparent that other forms of this method could be adopted by one skilled in the art, such as by substituting various other suggested chemical elements, or by modifying the process parameters such as the laser or the target composition. Accordingly, the scope of our invention is to be limited only by the following claims.

Where particular aspects of the present invention is defined herein in terms of ranges, it is intended that the invention includes the entire range so defined, and any sub-range or multiple sub-ranges within the broad range. By way of example, where the invention is described as comprising about 1 to about 100% by weight of component A, it is intended to convey the invention as including about 5 to about 25% by weight of component A, and about 50 to about 75% by weight of component A. Likewise, where the present invention has been described herein as including $A_{1-100}B_{1-50}$, it is intended to convey the invention as $A_{1-60}B_{1-20}$, $A_{60-100}B_{25-50}$ and $A_{43}B_{37}$.

The embodiments of the invention in which an exclusive property or privilege is claimed are defined as follows:

1. A method for forming thin films of crystalline cub boron nitride phosphide comprising the following steps:
   providing a silicon substrate oriented essentially throughout along the (100) crystallographic axis of the substrate;
   providing a target comprising hexagonal boron nitride and boron phosphide, said target being disposed in proximity with said silicon substrate;
   inducing vaporization of said target using a pulsed excimer laser operating at parameters sufficient to dissociate and vaporize said hexagonal boron nitride/boron phosphide target to atoms/ions;
   heating said substrate to a temperature sufficient to sustain crystal growth, such that the vaporized boron, nitrogen and phosphorus atoms/ions deposit onto a surface of said silicon substrate to form a thin film layer of crystalline cubic boron nitride phosphide.

2. A method for forming thin films of crystalline cub boron nitride phosphide as recited in claim 1 wherein said laser is a KrF excimer laser source.

3. A method of forming a cubic boron nitride film substantially free of pin holes on a silicon substrate comprising:
   providing a target having a plurality of regions of hexagonal boron nitride/boron phosphide;
   inducing vaporization of a first region of said target using a laser so that the vaporized material deposits upon said substrate to form a first layer on said substrate having the formula $BN_{1-x}P_x$ where $x=0.23$ and so that said film is substantially free of pin holes;

selectively inducing vaporization of other regions of said target using said laser so that successive layers of material are deposited on said substrate, each layer having a lower concentration of phosphorous than the previous layer and so that the top layer is substantially pure cubic boron nitride.

4. A method as set forth in claim 3 wherein said successive layers are deposited so that said top layer of substantially pure cubic boron nitride is substantially free of pin holes.

5. A method comprising:
providing a silicon substrate;
providing a first target of hexagonal boron nitride diluted with phosphorous, and a second target having the formula $BN_{1-x}P_x$ where x is about 0.23, said targets being disposed in proximity with said silicon substrate;
inducing vaporization of a portion of said first target using a laser sufficient to dissociate and vaporize said portion of the first target so that the vaporized material of the first target deposits onto a surface of said substrate to form a first thin film of a ternary compound; and
inducing vaporization of a portion of said second target using a laser sufficient to dissociate and vaporize said portion of the second target so that the vaporized material of the second target deposits on the surface of the first thin film to form a second thin film having the formula $BN_{1-x}$ p where $0 \leq x \leq 0.23$.

6. A method as set forth in claim 5 wherein said first thin film is substantially free of pin holes.

7. A method as set forth in claim 6 wherein said first thin film is completely epitaxial with the underlying substrate.

8. A method of a film of ternary compound comprising:
providing a substrate;
providing a target comprising boron, nitrogen and phosphorus, said target being disposed in proximity with said substrate;
inducing vaporization of said target using a pulsed excimer laser operating at parameters sufficient to dissociate and vaporize said target to form atoms-/ions, such that the vaporized material deposits onto a surface of said substrate to form a thin film layer comprising a ternary compound of boron, nitrogen and phosphorus having a lattice constant ranging from about 0.362 to about 0.454 nanometers, said film having a cubic crystallographic structure wherein phosphorus is substituted for nitrogen only.

9. A method as set forth in claim 8 wherein said film has a lattice constant of about 0.383 nanometers.

10. A method of making an article comprising:
providing a substrate;
providing a target comprising boron nitride, said target being disposed in proximity with said substrate;
inducing vaporization of said target using a pulsed laser operating at parameters sufficient to dissociate and vaporize said boron nitride target to atoms-/ions;
directing a separate source of nitrogen ions at said substrate so that said atom/ions from said vaporized target and said nitrogen ion from said separate source deposit on a surface of said substrate to produce a homogeneous and adherent film comprising cubic boron nitride.

11. A method as set forth in claim 10 wherein said film is peel and chemical resistant.

12. A method as set forth in claim 10 wherein said substrate comprises a metal.

* * * * *